（12）United States Patent
Takase (10) Patent No.: US 7,256,630 B2
(45) Date of Patent: Aug. 14, 2007

(54) SYSTEM AND METHOD FOR PLL CONTROL

(75) Inventor: Satoru Takase, Round Rock, TX (US)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/137,078

(22) Filed: May 25, 2005

(65) Prior Publication Data

US 2006/0267643 A1 Nov. 30, 2006

(51) Int. Cl.
*H03L 7/06* (2006.01)
(52) U.S. Cl. .................................... 327/157; 327/160
(58) Field of Classification Search ............... None
See application file for complete search history.

(56) References Cited

U.S. PATENT DOCUMENTS 5,987,085 A * 11/1999 Anderson .............. 375/374
6,373,314 B2 * 4/2002 Oda ....................... 327/291
6,829,318 B2 * 12/2004 Kawahara ............. 375/376
6,903,587 B2 * 6/2005 Sasaki et al. .......... 327/165
6,989,718 B2 * 1/2006 Pretl et al. ............. 331/16
7,064,617 B2 * 6/2006 Hein et al. ............. 331/16

* cited by examiner

*Primary Examiner*—Cassandra Cox
(74) *Attorney, Agent, or Firm*—Sprinkle IP Law Group (57) ABSTRACT

Systems and methods for reducing the effects of the operation of logic on a phase-locked loop (PLL) circuit are disclosed. These systems and methods may allow a PLL circuit to compensate for the anticipated effects of an instruction before, substantially simultaneously with, or after the execution of the instruction. More particularly, logic associated with the issue of instructions in a system may provide a signal to a PLL in the system based on an instruction. The PLL may then be adjusted to compensate for the anticipated effects of the instruction based on this control signal.

18 Claims, 12 Drawing Sheets

SYSTEM AND METHOD FOR PLL CONTROL

TECHNICAL FIELD OF THE INVENTION

The present invention relates generally to phase-locked loop (PLL) circuits, and more particularly, to reducing jitter in a PLL circuit.

BACKGROUND OF THE INVENTION

Phase-locked loop (PLL) integrated circuits produce an oscillator frequency output which matches an input frequency signal or matches multiple times of input frequency. A typical PLL may include a phase-frequency detector, a charge pump, and a voltage-controlled oscillator.

Figure 1:
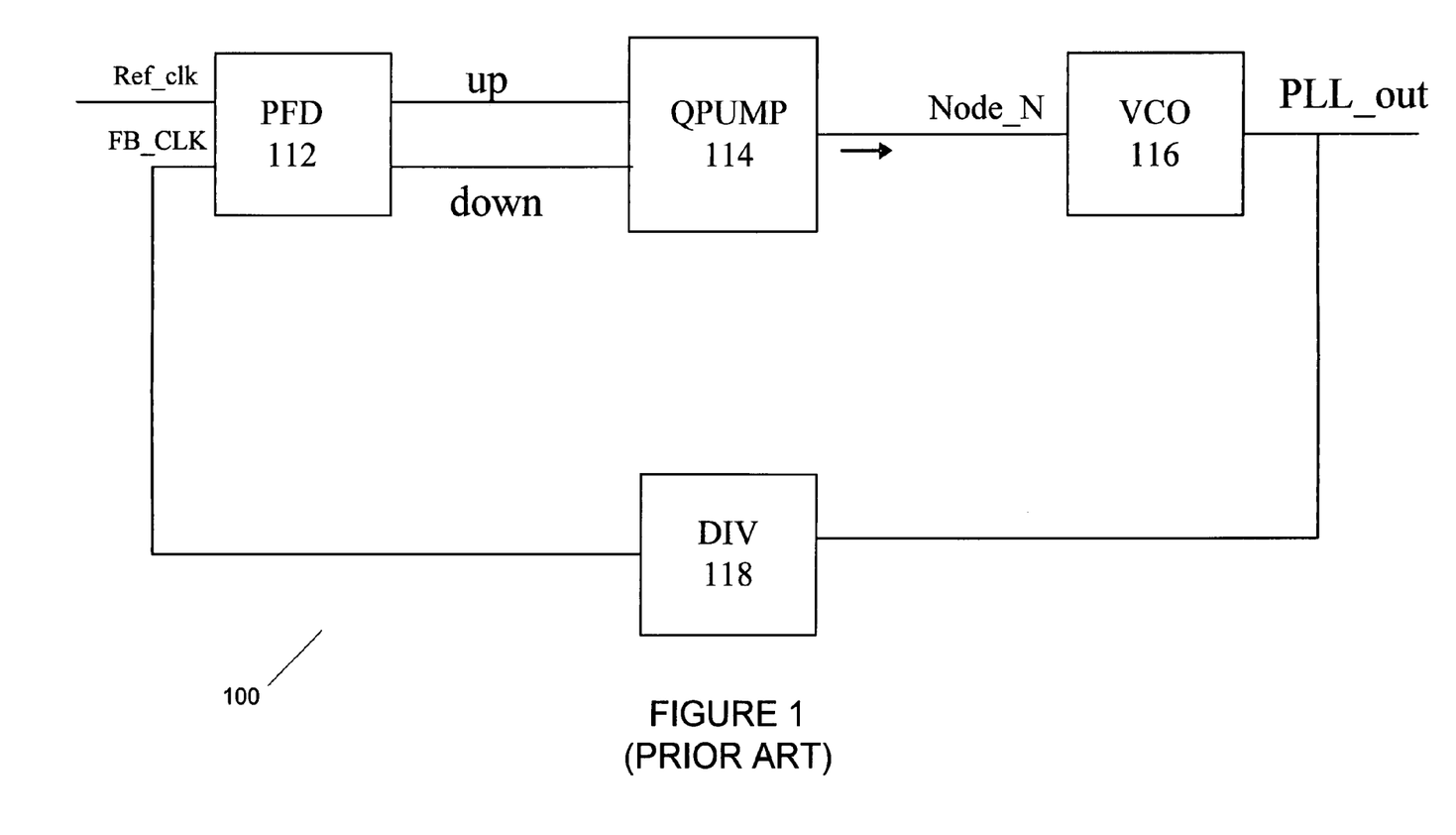
FIG. 1 is a block diagram of a typical phase-locked loop (PLL) circuit.

FIG. 1 is a block diagram of a typical phase-locked loop (PLL) circuit. PLL 100 includes phase-frequency detector (PFD) 112. PFD 112 detects the difference in phases and frequencies of two input signals, Ref_CLK and FB_CLK. From the difference detected, PFD 112 generates difference signals. Difference signals generated include positive current source, UP, and negative current source, DN (or 'DOWN'). Current sources UP and DN provide input to charge pump 114. Using current sources UP and DN, charge pump 114 generates a proportional charge. Thus, charge pump 114 provides a voltage to voltage-controlled oscillator (VCO) 116. VCO 116 generates a periodic signal according to input voltage at Node_N. This periodic signal may be referred to as PLL_Out.

This periodic signal generated by VCO 116, PLL_Out, is input to configurable frequency divider 118. For example, if given Ref_clk is 500 MHz when the frequency desired at PLL_Out is 1.0 GHz, a dividing ratio of '2' may be selected. Alternately, when PLL Out is desired to be 2.0 GHz, a dividing ratio '4' may be selected. As other examples, configurable frequency divider 118 may be configured with a dividing ratio of 1, 2, or 3. The output of VCO 116 is provided to frequency divider 118 en route to the feedback input to PFD 112. Thus, PLL_Out is input to feedback divider 118, and FB_CLK is output from feedback divider 118.

Phase-locked loops of the type depicted above are widely used in digital electronics, signal telemetry, and communications applications. Many applications require phase-locked loop (PLL) circuits which will work with high frequencies. In particular, PLL circuits are often utilized with semiconductor devices. More specifically, PLL circuits may be utilized in what is commonly referred to a system on a chip (SOC).

A system on a chip may be a chip, semiconductor or integrated circuit that holds substantially all of the necessary hardware and electronic circuitry for a particular system. Depending on the system desired, SOCs may include on-chip memory (RAM and ROM), processor logic, peripheral interfaces, I/O logic control, data converters, and other components that substantially comprise a particular system.

Figure 2:
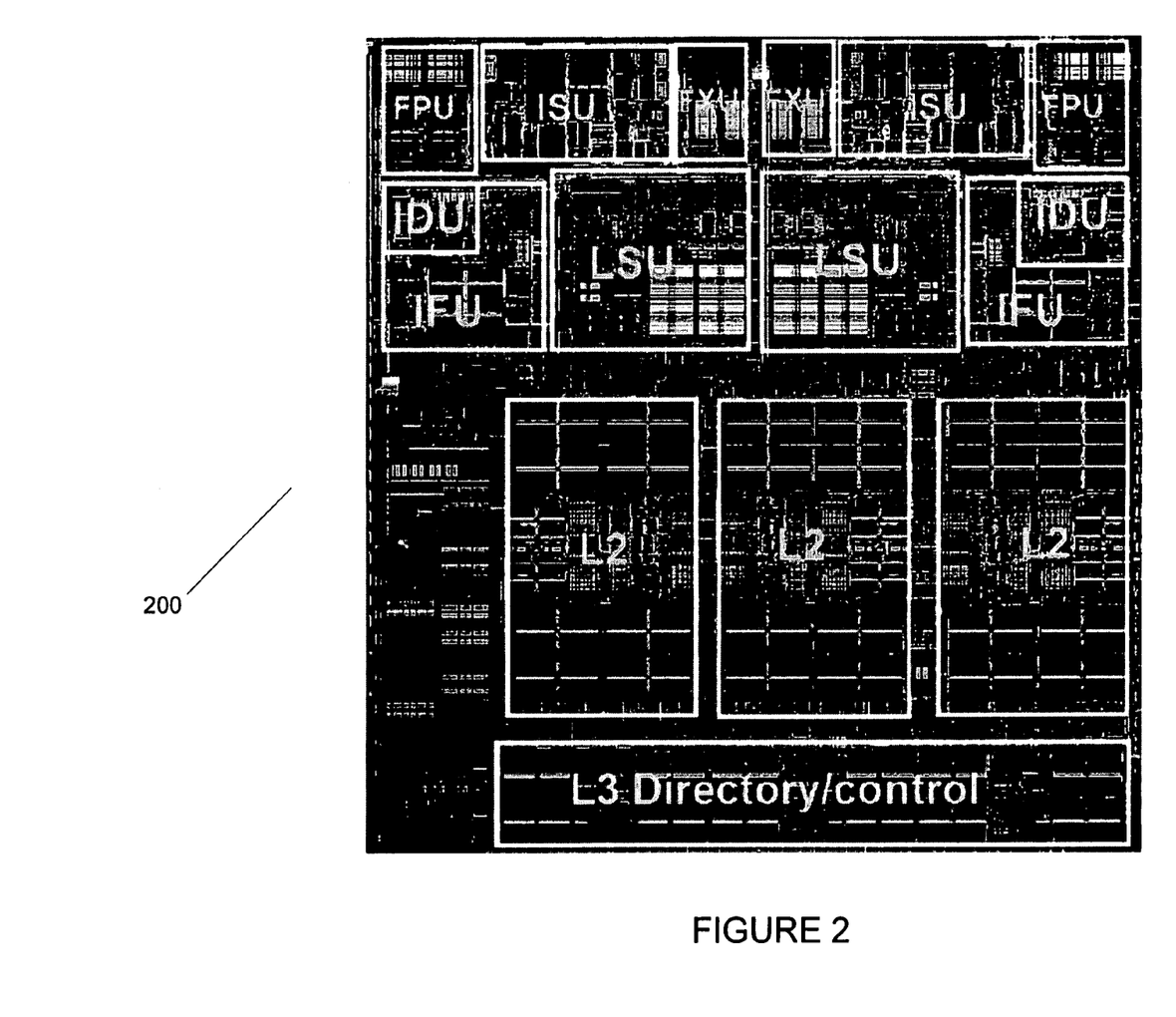
FIG. 2 depict one embodiment of a semiconductor.

FIG. 2 depicts one embodiment of a system on a chip. Semiconductor 200 may be a microprocessor, as is known in the art. This microprocessor may include various areas of logic utilized in conjunction with various tasks, such as level two cache logic, level three cache logic, load/store units, execution units, instruction issue unit, etc. Additionally, semiconductor 200 may utilize a PLL to provide a clock signal to one or more areas of circuitry or logic on semiconductor 200.

The benefits of implementing a microprocessor as a system on a chip like the one depicted above may include conservation of space as overall chip count is reduced, resulting in system cost reduction and improved performance. These benefits, however, do not come unencumbered. Namely, the close proximity of the components in a system on a chip may sometimes cause problems. More specifically, in the case of system on a chip such as that depicted in FIG. 2, the proximity of circuitry may cause problems with the PLL used to provide the clock signal to circuitry or logic on semiconductor 200.

In some cases, noise from outside the PLL circuit can cause PLL jitter. This noise may be the result of utilization of circuitry or logic in proximity to the PLL circuit. For example, if PLL is placed in proximity to an execution unit, during a particular instruction that execution unit may be relatively heavily utilized. This greater degree of utilization in turn results in relatively more noise being generated by the execution unit and, as PLL may be in proximity to the execution unit, this noise may cause jitter in the PLL circuit.

Additionally, in some cases, because of the placement of logic within semiconductor 200, during relatively heavy utilization of a particular area of logic on semiconductor 200, the PLL on semiconductor 200 may suffer from a power level drop, as these areas are consuming relatively more power during this period of heavy utilization. This power level drop may also induce jitter in the PLL on semiconductor 200 especially if the PLL is connected to the same power line as the logic in use. The PLL on semiconductor 200 typically must compensate for this jitter in order to once again achieve a locked state.

Figure 3:
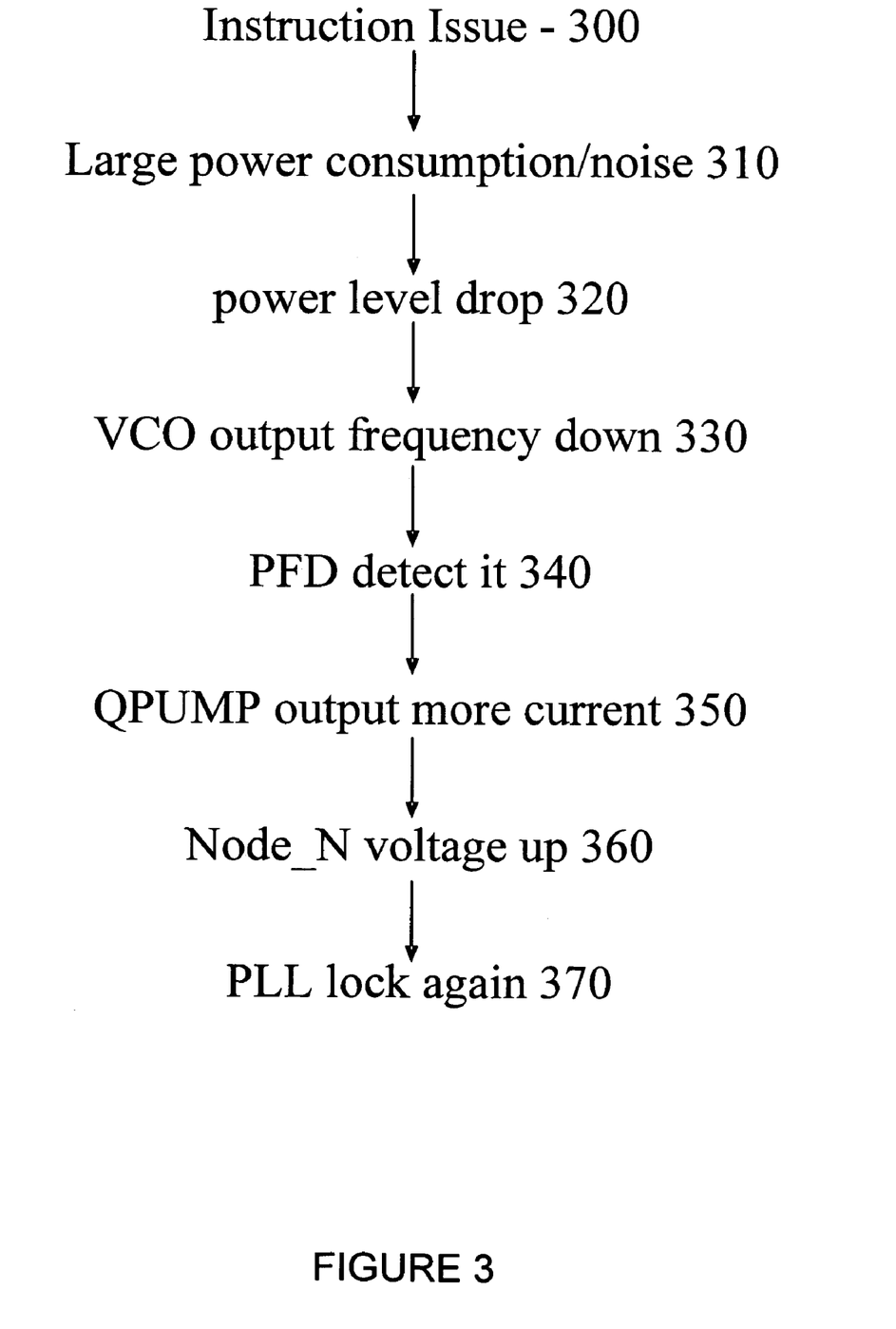
FIG. 3 is a flow diagram of one embodiment of a control loop for compensating for noise or a power drop in a phase-locked loop circuit.

A typical PLL control loop for compensating for these conditions and achieving lock in such situations is depicted in FIG. 3. An instruction is issued at step 300. This instruction may utilize or affect logic on the semiconductor. The issue of this instruction (step 300) results, at step 310, in relatively larger power consumption by the logic and a commensurate increase in the noise produced by the logic, at step 320. This noise or power drop may result, at step 330, in a decrease in the output frequency of VCO 116 of PLL 100. The output of VCO 116 is provided to the feedback input of PFD 112, which at step 340 detects the decrease in frequency by detecting the difference in phases or frequency between the Ref_CLK and FB_CLK inputs. From the difference detected, PFD 112 generates difference signals, resulting, at step 350 in charge pump 114 outputting more voltage. The output of the extra voltage results, at step 360, in an increase of the voltage level at Node N, in turn resulting in PLL 100 once again locking at step 370.

As can be seen, there is a delay between the issue of an instruction which will affect the PLL circuit (by causing a power drop at the PLL or noise in circuitry or logic in proximity to the PLL) and the PLL being able to compensate for the effects of the instruction.

Thus, a need exists for systems or methods which can substantially reduce the effects of the operation of logic on a PLL circuit.

SUMMARY OF THE INVENTION

Systems and methods for reducing the effects of the operation of logic on a phase-locked loop (PLL) circuit are disclosed. These systems and methods may allow a PLL circuit to compensate for the anticipated effects of an instruction before, substantially simultaneously with, or after the execution of the instruction. More particularly, logic associated with the issue of instructions in a system may provide a signal to a PLL in the system based on an instruction. The PLL may then be adjusted to compensate for the anticipated effects of the instruction based on this control signal. Specifically, based on the received control signal the output of a charge pump may be adjusted, the output of a voltage controlled oscillator may be adjusted, the output of a phase frequency detector may be adjusted or the configuration of a divider may be adjusted.

In one embodiment, logic may provide a compensation value to a phase-locked loop circuit based on an issued instruction, logic in the phase-locked loop responsive to the compensation value may receive the compensation value and a portion of the phase-locked loop may be adjusted based on the compensation value.

In one particular embodiment, the logic in the phase-locked loop responsive to the compensation value may include a counter operable to receive this compensation value and a charge pump whose output is determined by the value of the counter.

In another embodiment, the logic which provides a compensation value may comprise decode logic operable to receive the instruction and determine an incremental value based on the instruction; and an adder operable to output the compensation value based on the incremental value and a current value in the counter.

Embodiments of the present invention may provide the technical advantage of a PLL circuit which is less prone to jitter induced by the noise or power drop in logic or circuitry in proximity to the PLL. By anticipating the effects of an issued instruction the time necessary for a PLL circuit to adjust or compensate for the effects of the operation of logic induced by the execution of an instruction may be reduced or substantially eliminated, as the effects of the execution of an instruction on the output of the PLL may not have to be detected before these effects can be compensated for.

These, and other, aspects of the invention will be better appreciated and understood when considered in conjunction with the following description and the accompanying drawings. The following description, while indicating various embodiments of the invention and numerous specific details thereof, is given by way of illustration and not of limitation. Many substitutions, modifications, additions or rearrangements may be made within the scope of the invention, and the invention includes all such substitutions, modifications, additions or rearrangements.

BRIEF DESCRIPTION OF THE DRAWINGS

The drawings accompanying and forming part of this specification are included to depict certain aspects of the invention. A clearer impression of the invention, and of the components and operation of systems provided with the invention, will become more readily apparent by referring to the exemplary, and therefore nonlimiting, embodiments illustrated in the drawings, wherein identical reference numerals designate the same components. Note that the features illustrated in the drawings are not necessarily drawn to scale.

DETAILED DESCRIPTION

The invention and the various features and advantageous details thereof are explained more fully with reference to the nonlimiting embodiments that are illustrated in the accompanying drawings and detailed in the following description. Descriptions of well known starting materials, processing techniques, components and equipment are omitted so as not to unnecessarily obscure the invention in detail. It should be understood, however, that the detailed description and the specific examples, while indicating preferred embodiments of the invention, are given by way of illustration only and not by way of limitation. After reading the specification, various substitutions, modifications, additions and rearrangements will become apparent to those skilled in the art from this disclosure which do not depart from the scope of the appended claims.

Attention is now directed to systems and methods for reducing the effects of the operation of logic on a phase-locked loop (PLL) circuit. These systems and methods may allow a PLL circuit to compensate for the anticipated effects of an instruction before, substantially simultaneously with, or after the execution of the instruction. More particularly, logic associated with the issue of instructions in a system may provide a signal to a PLL in the system based on an instruction. The PLL may then be adjusted to compensate for the anticipated effects of the instruction based on this control signal. Specifically, based on the received control signal the output of a charge pump may be adjusted, the output of a voltage controlled oscillator may be adjusted, the output of a phase frequency detector may be adjusted or the configuration of a divider may be adjusted. In this manner, the time necessary for a PLL circuit to adjust or compensate for the effects of the operation of logic induced by the execution of an instruction may be reduced or substantially eliminated, as the effects of the execution of an instruction on the output of the PLL may not have to be detected before these effects can be compensated for.

Figure 4:
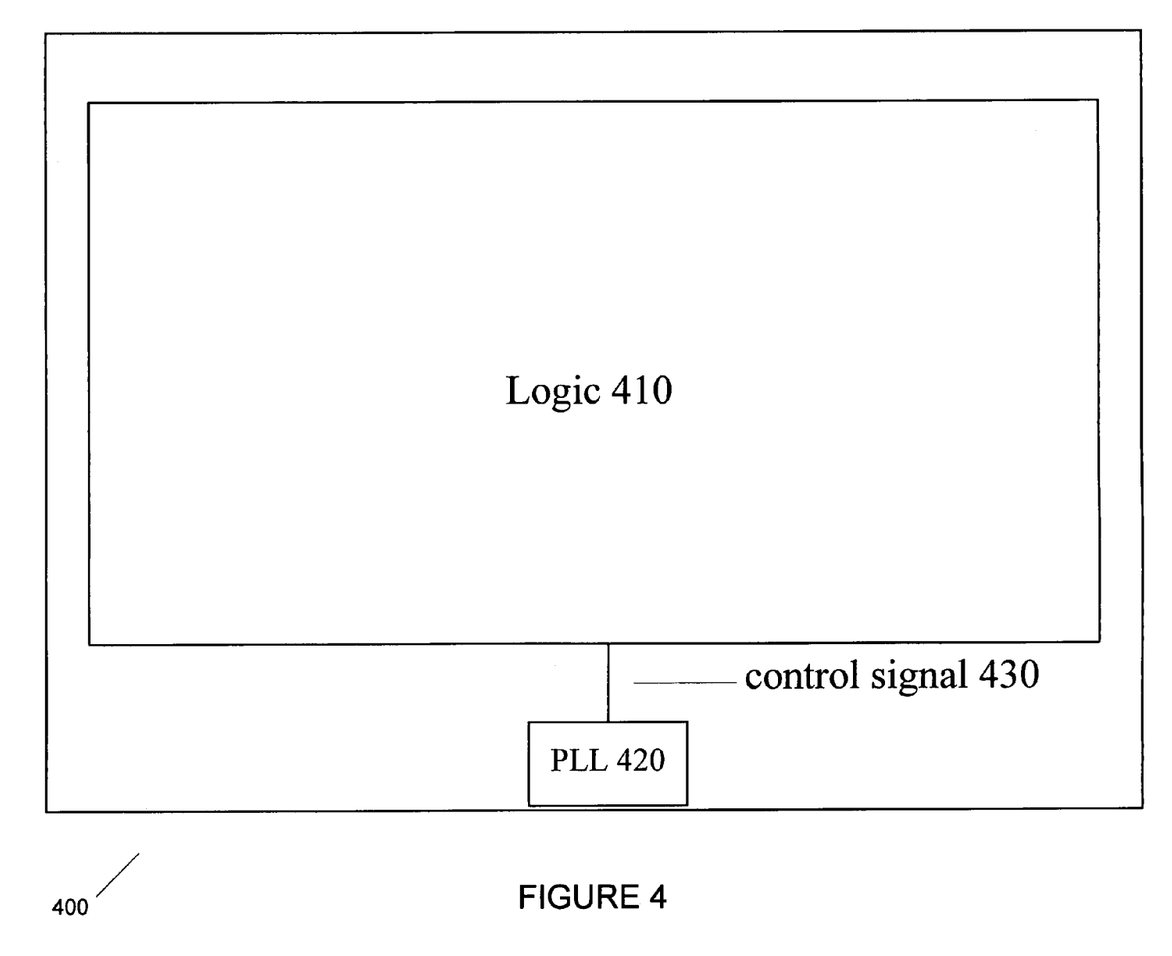
FIG. 4 is a block diagram of one embodiment of a semiconductor employing an embodiment of the present invention.

FIG. 4 depicts a block diagram of one embodiment of a system employing an embodiment of the systems and methods of the present invention. Semiconductor 400 consists of logic 410 operable to implement at least a portion of a system on a chip. Semiconductor 400 may also consist of PLL 420 operable to provide a clock signal to one or more portions of logic or circuitry 410. As mentioned above, PLL 410 may be affected by the operation of logic or circuitry 400. More specifically, when an instruction is executed by a portion of logic 400, the operation of the portion of logic 410 may induce noise, or cause a power drop, which affects PLL 410.

In one embodiment, to help reduce the effects of the operation of any portion of logic 410 on the operation of PLL 420 during an execution of an instruction, before or substantially simultaneously with the issue of the instruction, control signal 430 may be provided from logic 410. PLL 420 may be adjusted to compensate for the anticipated effects of the instruction based on control signal 430

Figure 5:
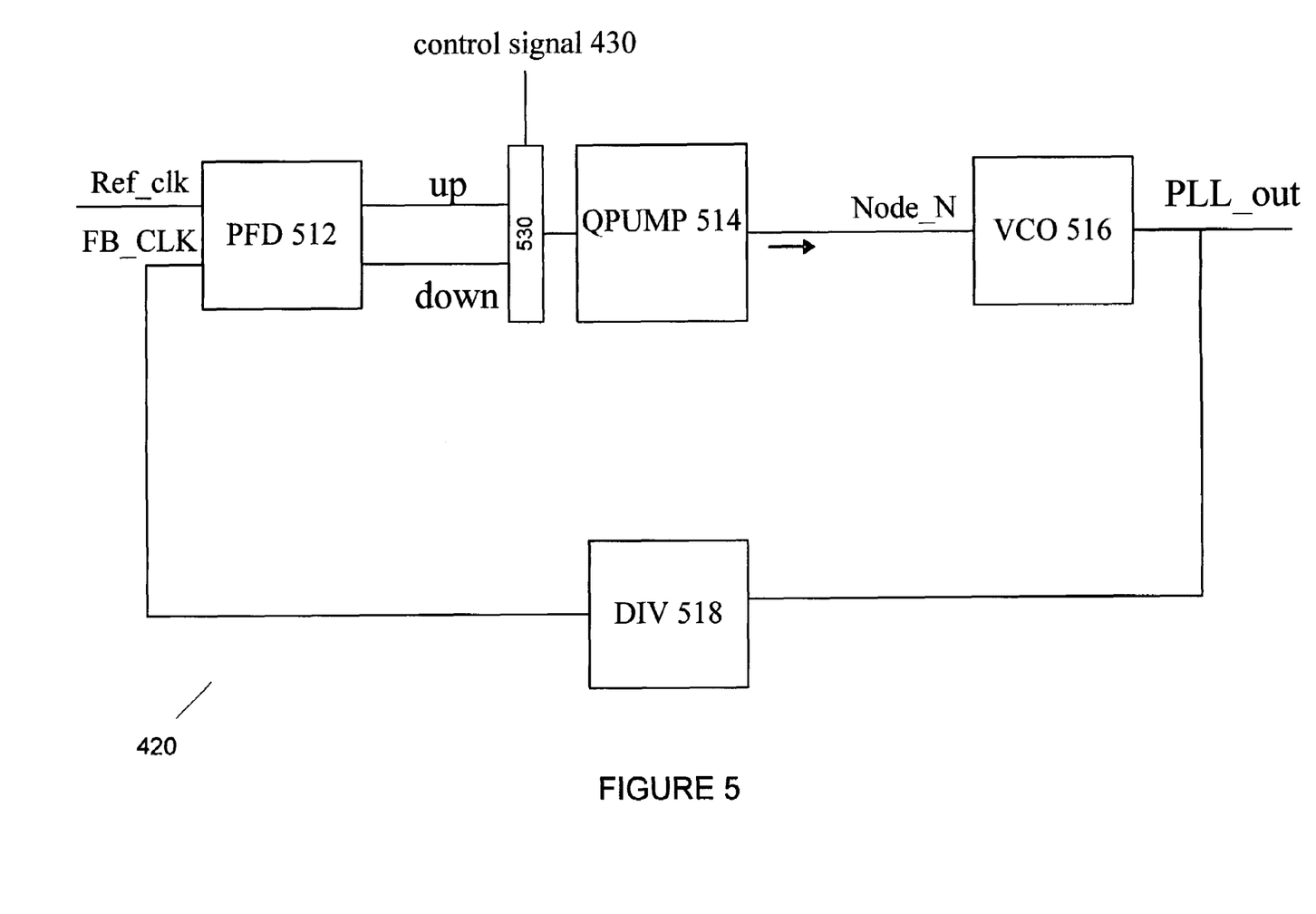
FIG. 5 is a block diagram of one embodiment of a phase-locked loop circuit.

FIG. 5 depicts one embodiment of a PLL circuit for use with the embodiment of the invention described with respect to FIG. 4. PLL 420 includes phase-frequency detector (PFD) 512. PFD 512 detects the difference in phases and frequencies of two input signals, Ref_CLK and FB_CLK. From the difference detected, PFD 512 generates difference signals. Difference signals generated include positive current source, UP, and negative current source, DN (or 'DOWN'). Current sources UP and DN provide input to counter 530. Additionally, counter 530 is coupled to control signal 430 and is operable to have its value set based on control signal 430. Thus, the value of counter 530 depends on current sources UP and DN and control signal 430. Counter 530 may be incremented or decremented based on the current sources UP and DN, respectively, or have its value set by control signal 430.

Based on the value of counter 530, charge pump 514 generates a proportional charge. Thus, charge pump 514 provides voltage to voltage-controlled oscillator (VCO) 516 at Node_N. VCO 516 generates a periodic signal according to input voltage at Node_N.

The periodic signal generated by VCO 516, PLL_Out, is input to configurable frequency divider 518. The output of configurable frequency divider 518, is provided to the feedback input to PFD 512. Thus, PLL_Out is input to feedback divider 518, and FB CLK is output from feedback divider 518.

During operation of PLL 420, before or substantially simultaneously with the issue or execution of an instruction, logic 410 may place a compensation value on control signal 430. This value may be placed in counter 530, to increase the charge produced by charge pump 514 in order to compensate for the power drop or noise introduced by the effects of the logic 410 during execution of the instruction.

Conversely, before, substantially simultaneously with, or after, the end of the execution of the instruction, logic 410 may place a decompensation value on control signal 430 based on the compensation value. This decompensation value may be determined based on the compensation value and placed in counter 530 to decrease the proportional charge produced by charge pump 514 to the level previous to the issue or execution of the instruction.

Figure 6:
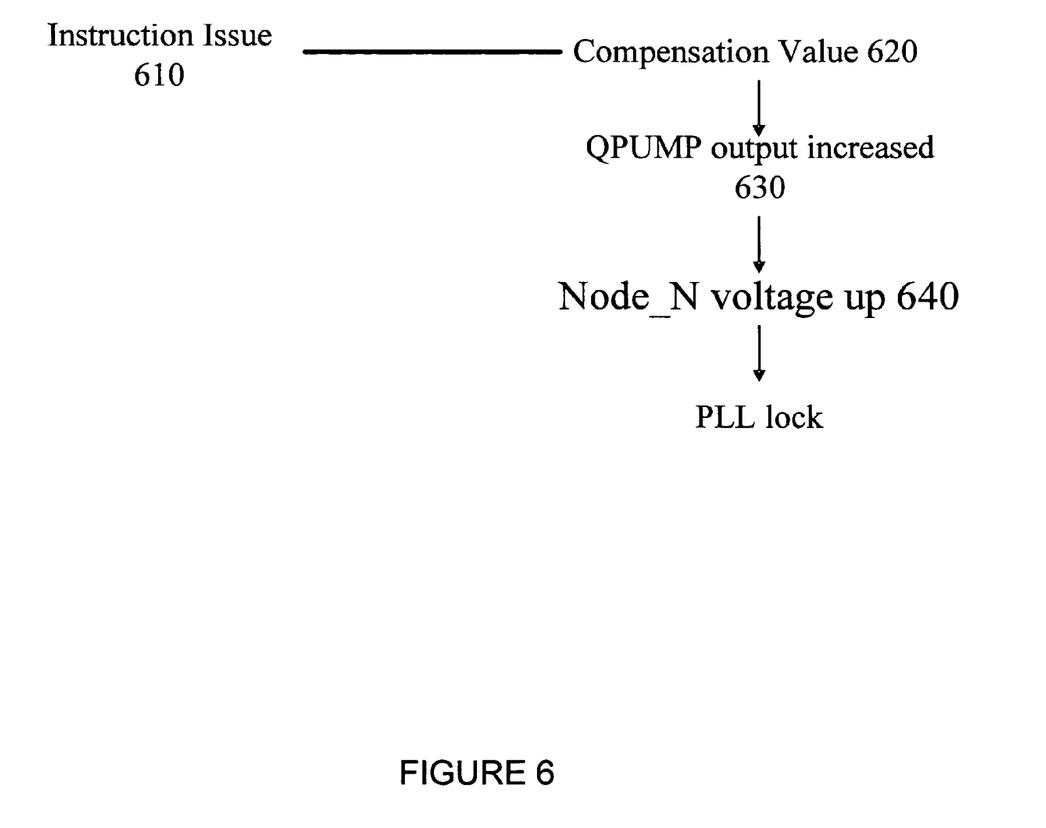
FIG. 6 is a flow diagram of one embodiment of a control loop for compensating for noise or a power drop in a PLL.

Thus, a control loop for compensating a PLL for the effects of the operation of logic caused by the execution of an instruction may resemble the embodiment of the control loop depicted in FIG. 6. Substantially simultaneously with instruction issue at step 610, a value is sent to the PLL on control signal at step 620. This incremental value results in an increased output of the charge pump of the PLL at step 630, resulting in increased voltage level at Node_N at step 640. As can be seen from a comparison of the control loops depicted in FIG. 2 and FIG. 6, the control loop described with respect to FIG. 6 may eliminate a great deal of the time traditionally needed by a PLL to recover from the effects of a power drop or induced noise.

Figure 7:
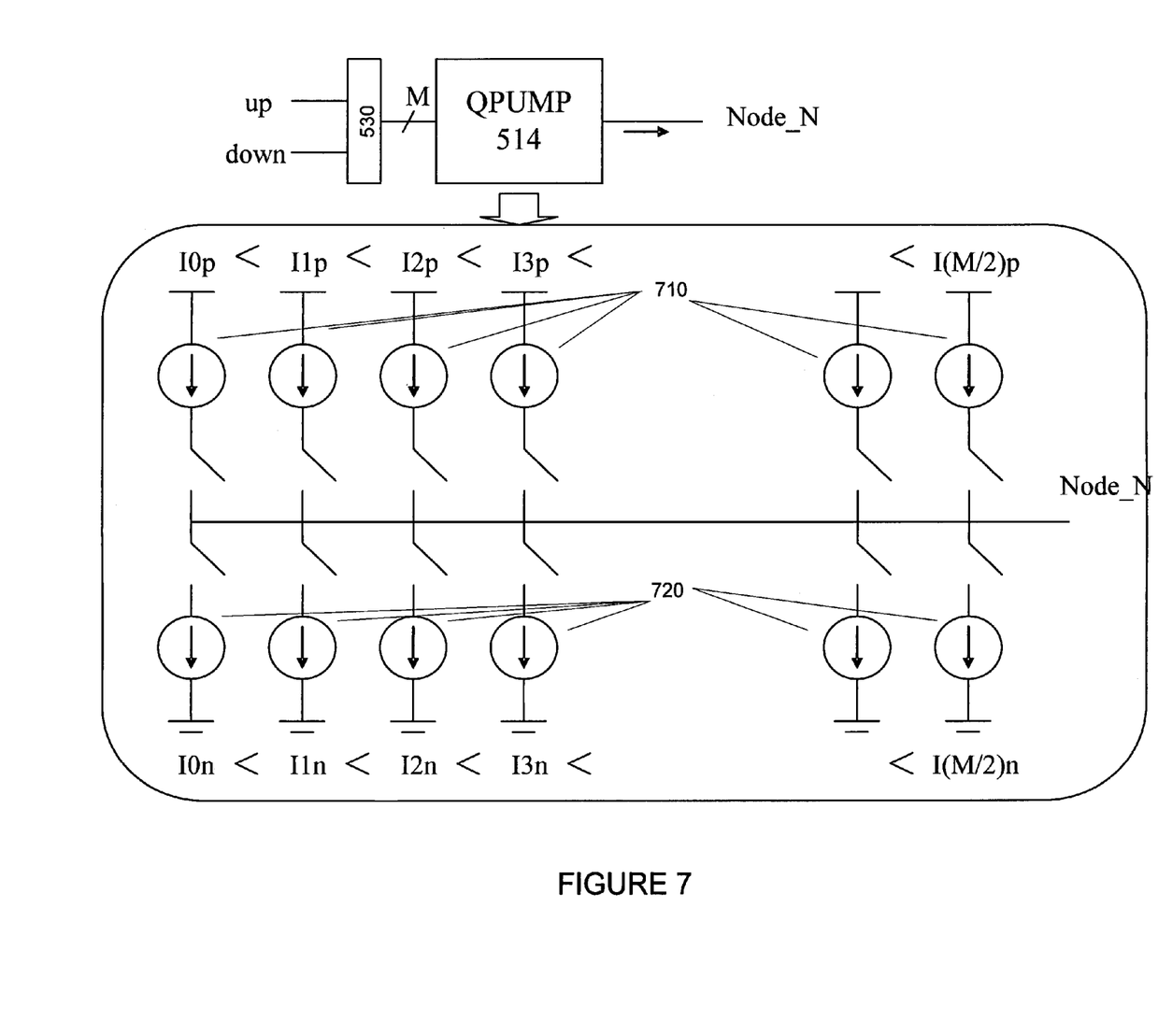
FIG. 7 is an illustration of one embodiment of a digital charge pump.

Turning now to FIG. 7, one embodiment of a charge pump for use with the PLL depicted in FIG. 5 is illustrated. Charge pump 514 may be a digital charge pump controlled by the value of counter 530. More particularly, charge pump 514 is coupled to counter 530 and is operable to receive a value of counter 530, wherein the value is represented by "M" bits. Charge pump 514 may includes 'M' current sources 710, 720, with half the current sources 710 being positive current sources and half the current sources 720 being negative current sources 720. Each of current source 710, 720 may be operable to provide a different amount of current to the output of charge pump 514 when coupled to the output of the charge pump. During operation of charge pump 514 a number of these current sources 710, 720 may be coupled to the output of charge pump 514 based on the value of counter 530. Thus, the output of charge pump 514 is based on the value of counter 530.

Figure 8:
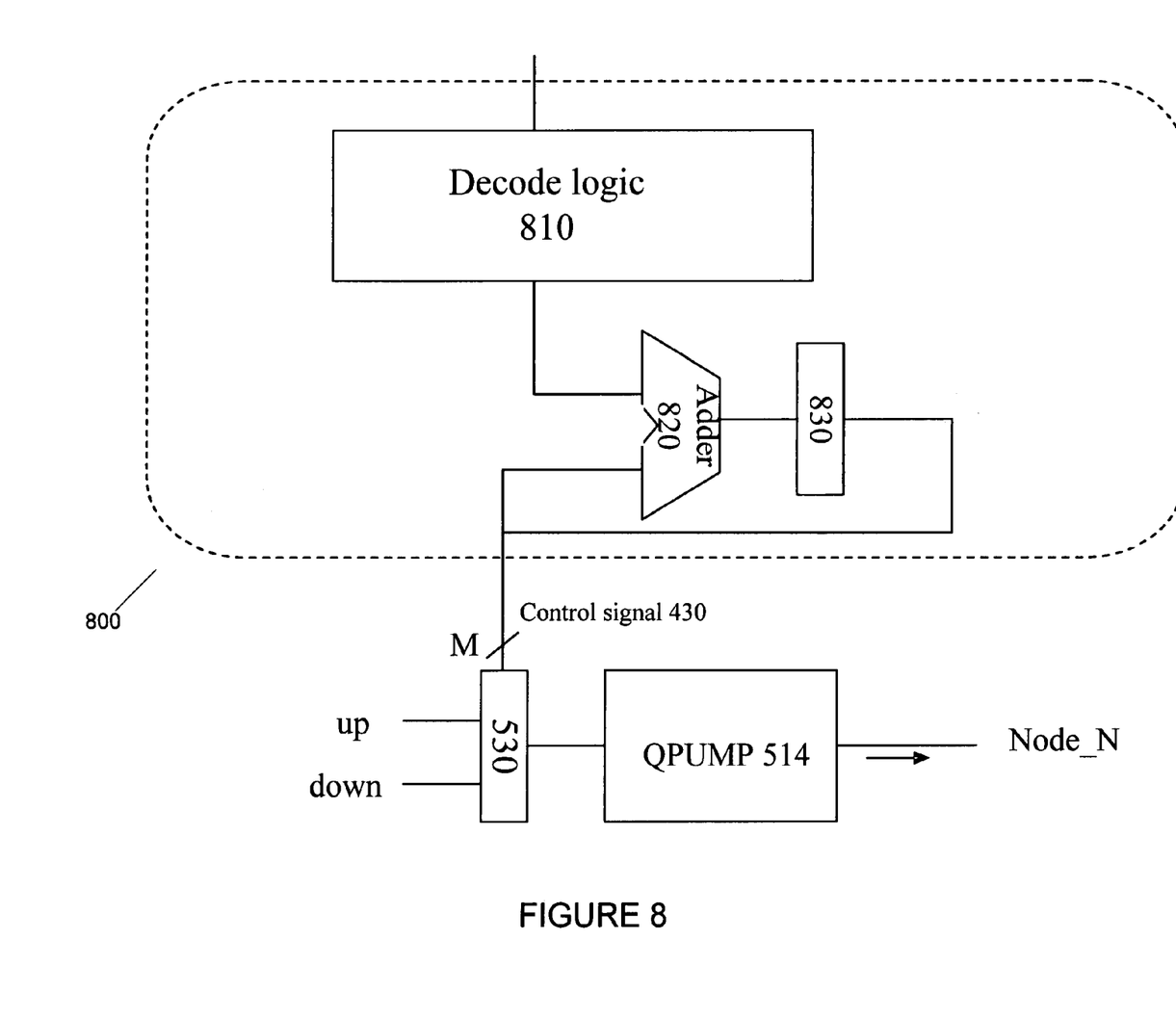
FIG. 8 is a block diagram of one embodiment of logic for producing a control signal according to one embodiment of the present invention.

Moving on to FIG. 8, a more detailed representation of one embodiment of logic for providing control signal 430 to counter 530 is depicted. Logic 800 may receive an instruction and produce a compensation value on control signal 430. More particularly, decode logic 810 may be coupled to an issue stage of an instruction pipeline of semiconductor 400, and receive an instruction in this issue stage. Based on the instruction, decode logic 810 may generate an incremental value by which to increment the current value of counter 530 in order that PLL 420 may compensate for the effects of the execution of the instruction. This incremental value may be added to the value currently in counter 530 by adder 820 to generate the compensation value. The compensation value may temporarily be stored in register 830 before being sent via control signal 430 to counter 530.

Decode logic 810 may also determine how long the noise or power drop created by the execution of the instruction may last. At the end of this time period or duration, decode logic 810 may generate a decremental value by which to decrement the value of counter 530 in order that the value of counter 530 decremented by the substantially the same value as it was incremented by to compensate for the execution of the instruction. This decremental value may be decremented from the value currently in counter, 530 by adder 820 in order to generate a decompensation value. This decompensation value may be temporarily stored in register 830 before being sent via control signal 430 to counter 530.

In one embodiment, the incremental value, decremental value, the length of time between placing the compensation value on control signal 430 and placing decompensation vale on control signal 430, the incremental value and decremental value are determined based on the instruction. As the location of PLL 420 and logic 410 utilized by a particular instruction will be dependent on the system in which the embodiments of the systems and methods of the present invention are utilized it will be apparent that the particular implementation of logic 810 will depend on the system with which the embodiment of the present invention is utilized and the particular implementation of logic 810 may also be determined based on such factors as the architecture of the system with which it utilized, the location of various types of logic, the location of the PLL, the blocks of logic utilized by certain instructions etc.

For example, a compensation value and decompensation value may be issued by decode logic 810 for all instructions, while in other embodiments, a compensation value and decompensation value may be issued only for certain instructions. Additionally, in some embodiments control signal 430 may be updated or issued with every clock cycle of PLL 420, or may be updated by decode logic 800 when an instruction for which logic 800 wishes to compensate for issues or has completed execution.

Figure 9:
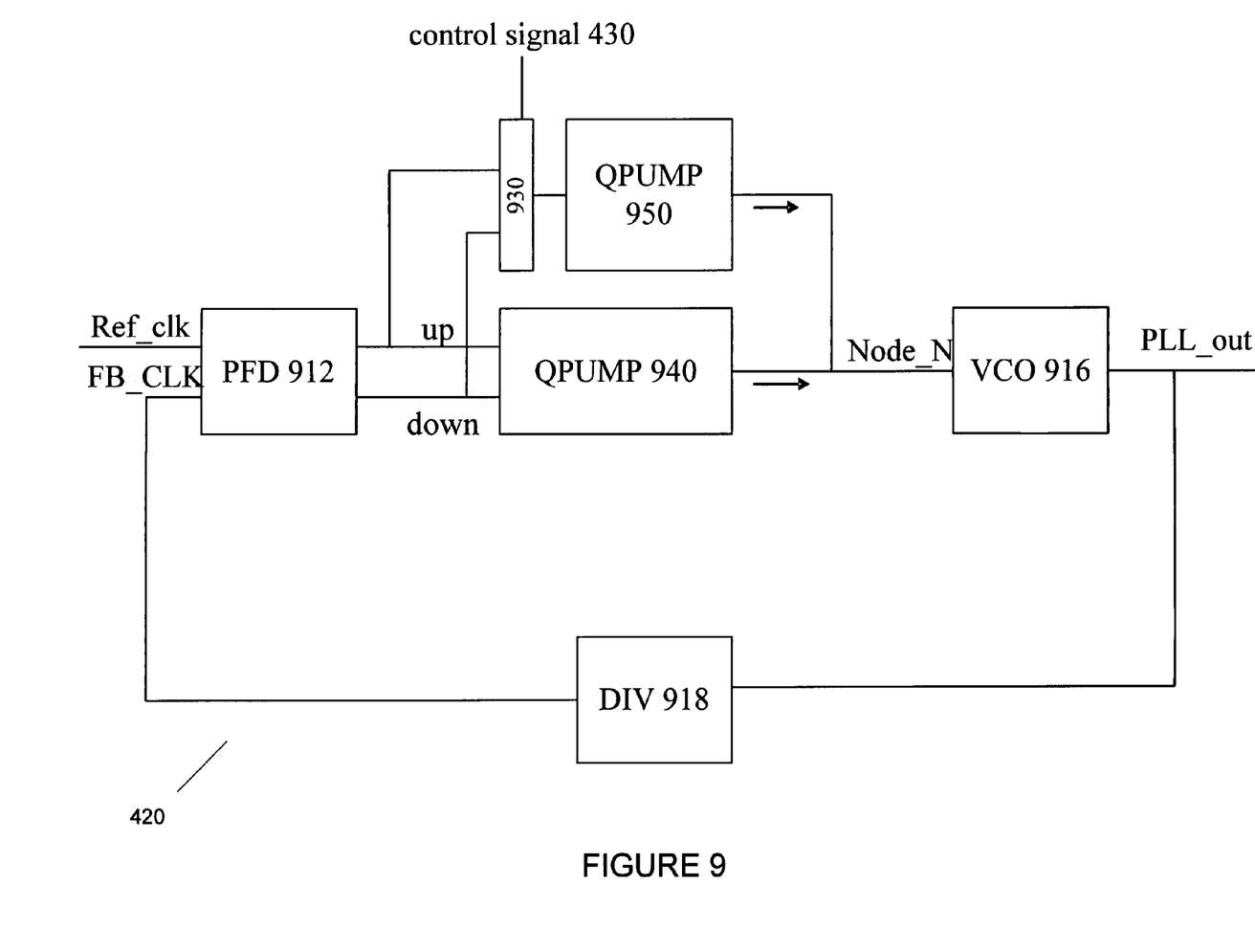
FIG. 9 is a block diagram of one embodiment of a phase-locked loop circuit.

FIG. 9 depicts another embodiment of a PLL circuit for use with the embodiment of the invention described with respect to FIG. 4. PLL 420 includes phase-frequency detector (PFD) 912. PFD 912 detects the difference in phases and frequencies of two input signals, Ref_CLK and FB_CLK. From the difference detected, PFD 912 generates difference signals. Difference signals generated include positive current source, UP, and negative current source, DN (or 'DOWN'). Current sources UP and DN provide input to counter 930 and charge pump 940. Counter 930 is coupled to digital charge pump 950 and to control signal 430 and is operable to have its value set based on control signal 430. Thus, the value of counter 930 depends on current sources UP and DN and control signal 430, as counter 930 is incremented or decremented based on the current sources UP and DN, respectively, or may have its value set by control signal 430.

Based on the value of counter 930, digital charge pump 950 generates a proportional charge. Using current sources UP and DN, charge pump 940 generates a proportional charge. Thus, charge pumps 940, 950 provide voltage at Node_N to voltage-controlled oscillator (VCO) 916. VCO 916 generates a periodic signal according to input voltage at Node_N.

This periodic signal generated by VCO 916, PLL_Out, is input to configurable frequency divider 918. The output of configurable frequency divider 918, is provided to the feedback input to PFD 912. Thus, PLL_Out is input to frequency divider 918, and FB_CLK is output from frequency divider 918.

During operation of PLL 420, before or substantially simultaneously with the issue or execution of an instruction, logic 410 may place a compensation value on control signal 430. Counter 930, may be set to this compensation value, increasing the proportional charge produced by charge pump 950 to compensate for the power drop or noise introduced by the operation of logic 410 during execution of the instruction.

Conversely, before, substantially simultaneously with, or after the end of, the execution of the instruction, logic 410 may place a decompensation value on control signal 430. Counter 930 may be set to this decompensation value, in turn decreasing the proportional charge produced by charge pump 950, as there may no longer be a need to compensate for the effects of the instruction.

Figure 10:
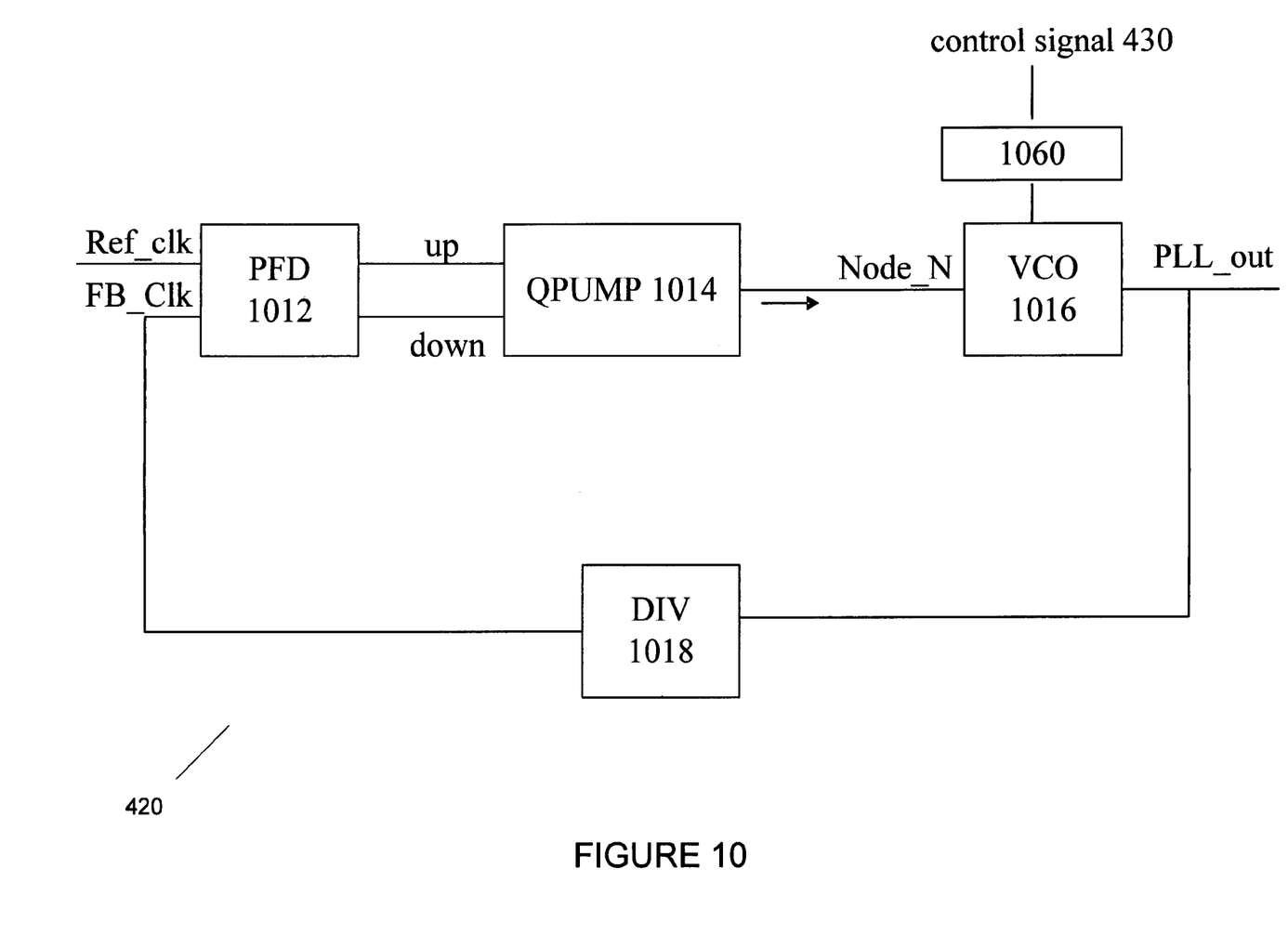
FIG. 10 is a block diagram of one embodiment of a phase-locked loop circuit.

Turning to FIG. 10, another embodiment of a PLL circuit for use with the embodiment of the invention described with respect to FIG. 4 is depicted. PLL 420 includes phase-frequency detector (PFD) 1012. PFD 1012 detects the difference in phases and frequencies of two input signals, Ref_CLK and FB_CLK. From the difference detected, PFD 1012 generates difference signals. Difference signals generated include positive current source, UP, and negative current source, DN (or 'DOWN'). Current sources UP and DN provide input to charge pump 1040. Using current sources UP and DN, charge pump 1014 generates a proportional charge. Thus, charge pump 1014 provides voltage at Node_N to digital voltage-controlled oscillator (VCO) 1016. VCO 1016 is also coupled to register 1060 which is operable to receive a value from control signal 430. Thus, VCO 1016 generates a periodic signal according to input voltage at Node_N and the value in register 1060.

This periodic signal generated by VCO 1016, PLL_Out, is input to configurable frequency divider 1018. The output of configurable frequency divider 1018, is provided to the feedback input of PFD 1012. Thus, PLL_Out is input to divider 1018, and FB_CLK is output from divider 1018.

During operation of PLL 420, before or substantially simultaneously with the issue of an instruction, logic 410 may issue a compensation value on control signal 430. This value may be placed in register 1060 such that digital VCO 1016 can compensate for the power drop or noise introduced by the operation of logic 410 during execution of the instruction which may cause the voltage at Node_N to drop. In turn, VCO 1016 generates a periodic signal according to input voltage at Node_N and the value in register 1060.

Conversely, substantially simultaneously with, or after the end of, the execution of the instruction, logic 410 may issue a decompensation value on control signal 430. This decompensation value may be placed in register 1060 as the voltage at Node_N may no longer be affected by the power drop or noise induced by the execution of the instruction. In turn, VCO 1016 generates a periodic signal according to input voltage at Node_N and the value in register 1060. Thus, the periodic signal produced by VCO 1016 may remain substantially constant despite the power drop or noise caused by the execution of an instruction.

Figure 11:
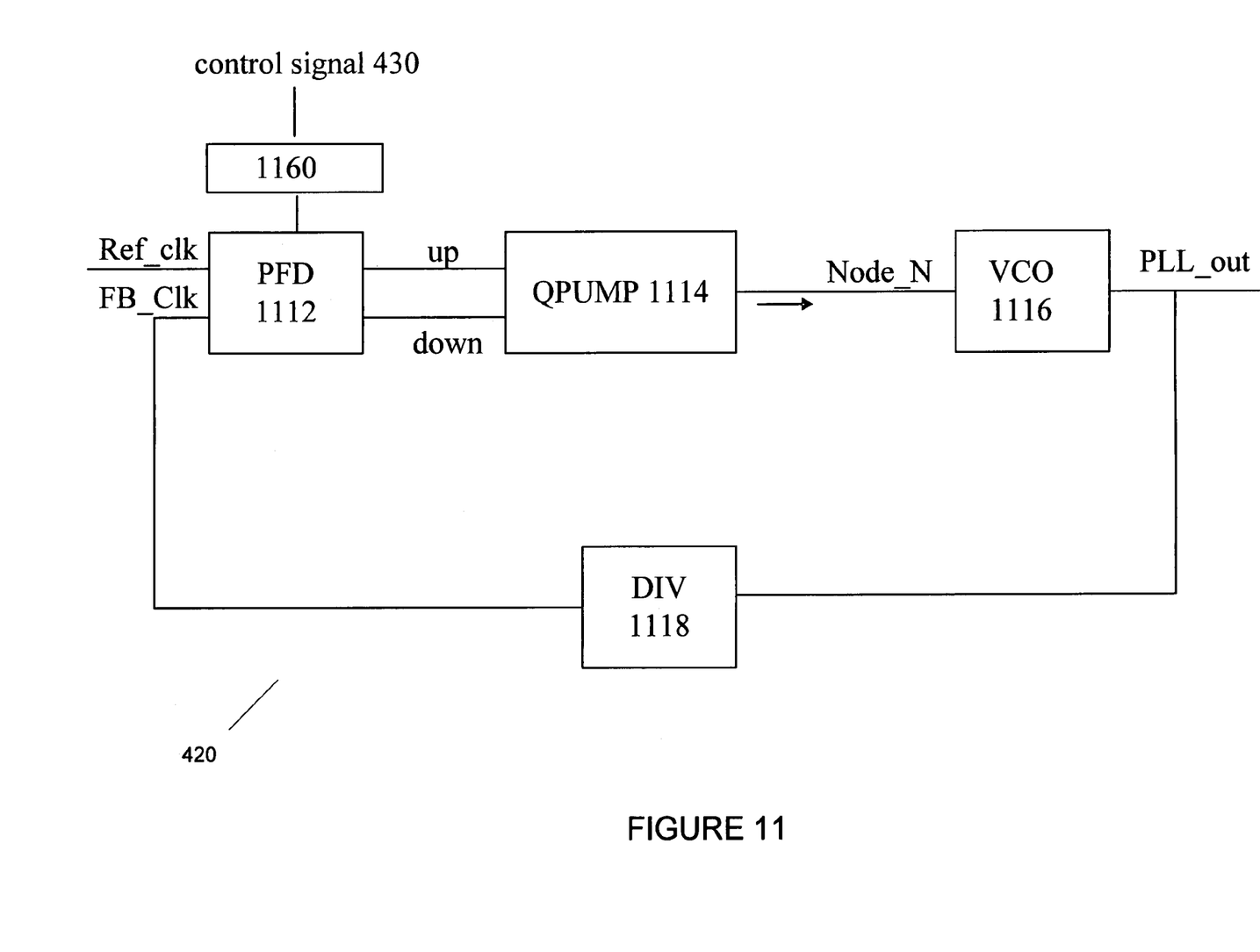
FIG. 11 is a block diagram of one embodiment of a phase-locked loop circuit.

Similarly, a control signal may be utilized in conjunction with a phase-frequency detector of a PLL in substantially the same manner. FIG. 11 depicts just such an embodiment of a PLL circuit for use with the embodiment of the invention described with respect to FIG. 4. PLL 420 includes digital phase-frequency detector (PFD) 1112. PFD 1112 detects the difference in phases and frequencies of two input signals, Ref_CLK and FB_CLK. PFD 1112 is also coupled to register 1160 which is operable to receive a value from control signal 430. From the difference detected between the two input signals and from the value of register 1160, PFD 1112 generates difference signals. Difference signals generated include positive current source, UP (or 'UP'), and negative current source, DN (or 'DOWN'). Current sources UP and DN provide input to charge pump 1114. Using current sources UP and DN, charge pump 1114 generates a proportional charge, IM. Thus, charge pump 1140 provides voltage at Node_N to voltage-controlled oscillator (VCO) 1116. VCO 1116 generates a periodic signal according to input voltage at Node_N.

This periodic signal generated by VCO 1116, PLL_Out, is input to configurable frequency divider 1118. The output of configurable frequency divider 1118, PLL_Out, is provided to divider 1118 en route to the feedback input of PFD 1112. Thus, PLL_Out is input to divider 1118, and FB_CLK is output from divider 1118.

During operation of PLL 420, before or substantially simultaneously with the issue or execution of an instruction, logic 410 may place a compensation value on control signal 430. This value may be placed in register 1160 to compensate for a power drop or noise introduced by the operation of logic 410 during execution of an instruction. In turn, PFD 1112 generates difference signals from the difference detected between the two input signals and the value in register 1160 such that the output of charge pump 1114 during the execution of the instruction is substantially similar to the output of charge pump 1114 before the execution of the instruction.

Conversely, substantially simultaneously with, or after the end of, the execution of the instruction, logic 410 may place decompensation value on control signal 430. This value may be placed in register 1160 as PLL 420 may no longer be affected by the power drop or noise induced by the execution of the instruction. Thus, the periodic signal produced by VCO 1016 may remain substantially constant despite the power drop or noise caused by the execution of an instruction.

Figure 12:
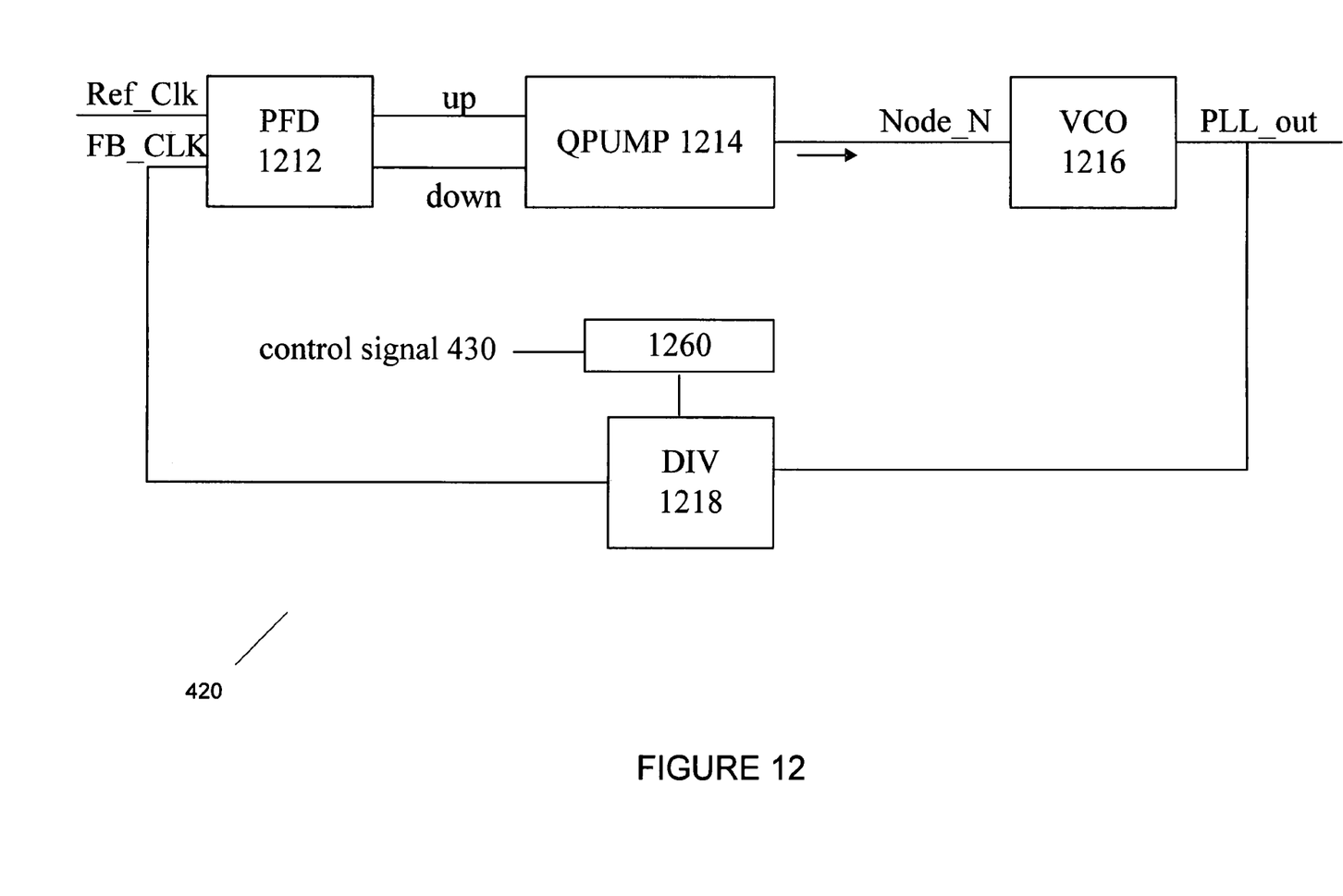
FIG. 12 is a block diagram of one embodiment of a phase-locked loop circuit.

FIG. 12 depicts yet another embodiment of a PLL circuit for use with the embodiment of the invention described with respect to FIG. 4. PLL 420 includes phase-frequency detector (PFD) 1212. PFD 1212 detects the difference in phases and frequencies of two input signals, Ref_CLK and FB_CLK. From the difference detected between the two input signals and from the value of the register, PFD 1212 generates difference signals. Difference signals generated include positive current source, UP, and negative current source, DN (or 'DOWN'). Current sources UP and DN provide input to charge pump 1214. Using current sources UP and DN, charge pump 1214 generates a proportional charge. Thus, charge pump 1214 provides voltage at Node_N to voltage-controlled oscillator (VCO) 1216. VCO 1216 generates a periodic signal according to input voltage at Node_N.

This periodic signal generated by VCO 1216, PLL_Out, is input to digital configurable frequency divider 1218. Frequency divider 1218 is also coupled to register 1260 which is operable to have its value set by control signal 430. Thus, the dividing ratio of frequency divider 1218 is based on the value in register 1260. The output of configurable frequency divider 1218 is provided to the feedback input of PFD 1212. Thus, PLL_Out is input to feedback divider 1218, and FB_CLK is output from feedback divider 1218.

During operation of PLL 420, before or substantially simultaneously with the issue or execution of an instruction, logic 410 may issue a compensation value on control signal 430. This value may be placed in register 1260 to compensate for a power drop or noise introduced by the operation of logic 410 during execution of an instruction. In turn, the dividing ratio of frequency divider 1218 may be set based on this value. This dividing ratio may decrease the frequency FB_CLK such that PLL 420 may compensate for this decreased frequency by increasing the output of charge pump 1214.

Conversely, substantially simultaneously with, or after the end of, the execution of the instruction, logic 410 may issue a decompensation value on control signal 430. This value may be placed back in register 1260 as PLL 420 may no longer be affected by the power drop or noise induced by the execution of the instruction. In turn, the dividing ratio of frequency divider 1218 may be set based on this value. Thus, the periodic signal produced by VCO 1016 may remain substantially constant despite the power drop or noise caused by the execution of an instruction.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component of any or all the claims.

What is claimed is:

1. A system for compensating a phase-locked loop for the effects of an instruction, comprising:

logic operable to provide a compensation value to a phase-locked loop circuit, wherein the compensation value is based on an instruction; and logic in the phase-locked loop responsive to the compensation value, wherein the logic in the phase locked loop circuit comprises:

a counter operable to hold a value and to receive the compensation value; and a first charge pump coupled to the counter, wherein the output of the first charge pump is based on the value of the counter.

2. The system of claim 1, wherein the first charge pump is a digital charge pump.

3. The system of claim 2, wherein the counter is couple to the output of a phase-frequency detector.

4. The system of claim 3, wherein the phase-locked loop comprises a second charge pump coupled to the output of the phase-frequency detector.

5. The system of claim 2, wherein the logic operable to provide the compensation value comprises:

decode logic operable to receive the instruction and determine an incremental value based on the instruction; and an adder operable to output the compensation value based on the incremental value.

6. The system of claim 5, wherein:

the decode logic is operable to determine a duration and a decremental value;

the adder is operable to output the decompensation value based on the decremental value; and the logic operable to provide the compensation value is further operable to provide the decompensation value at the end of the duration.

7. The system of claim 6, wherein the adder is operable to receive a first current value in the counter and output the compensation value based on the first current value of the counter and the incremental value and to receive a second current value in the counter and output the decompensation value based on the second current value of the counter and the decremental value.

8. A method for compensating a phase-locked loop for the effects of an instruction, comprising:

determining a compensation value based on an instruction;

providing the compensation value to logic in a phase-locked loop circuit, wherein the logic is responsive to the compensation value;

receiving the compensation value at a counter;

updating a value of the counter based on the compensation value; and producing a voltage from a first charge pump coupled to the counter based on the value of the counter.

9. The method of claim 8, wherein the first charge pump is a digital charge pump.

10. The method of claim 9, further comprising receiving the output of a phase-frequency detector at the counter, wherein the value of the counter is based on the output of the phase-frequency detector.

11. The method of claim 10, receiving the output of the phase-frequency detector at a second charge pump.

12. The method of claim 8, wherein the logic operable to provide the compensation value comprises:

receiving the instruction;

determining an incremental value based on the instruction; and determining the compensation value based on the incremental value.

13. The method of claim 12, further comprising:
determining a duration and a decremental value;
determining the decompensation value based on the decremental value; and
providing the decompensation value at the end of the duration.

14. The method of claim 13, further comprising:
receiving a first current value of the counter; and
determining the compensation value based on the current value of the counter and the incremental value.

15. The method of claim 14, further comprising:
receiving a second current value of the counter; and
determining the decompensation value based on the second current value of the counter and the decremental value.

16. A system for compensating a phase-locked loop for the effects of an instruction, comprising:
decode logic operable to receive an instruction and determine an incremental value, decremental value and a duration based on the instruction;
an adder operable to receive a first current value in the counter and output the compensation value based on the first current value of the counter and the incremental value and to receive a second current value in the counter and output the decompensation value based on the second current value of the counter and the decremental value at the end of the duration;
a counter operable to hold a value and to receive the compensation value and decompensation value; and
a first charge pump coupled to the counter, wherein the output of the first charge pump is based on the value of the counter.

17. A system for compensating a phase-locked loop for the effects of an instruction, comprising:
logic operable to provide a compensation value to a phase-locked loop circuit, wherein the compensation value is based on an instruction, wherein the instruction comprises an instruction used in an instruction set architecture of a processor, a microcode, a signal indicating a command or a signal indicating a state in an execution unit of the processor; and logic in the phase-locked loop responsive to the compensation value, wherein the logic in the phase locked loop circuit comprises:
a counter operable to hold a value and to receive the compensation value; and
a first charge pump coupled to the counter, wherein the output of the first charge pump is based on the value of the counter.

18. A method for compensating a phase-locked loop for the effects of an instruction, comprising:
determining a compensation value based on an instruction, wherein the instruction comprises an instruction used in an instruction set architecture of a processor, a microcode, a signal indicating a command or a signal indicating a state in an execution unit of the processor;
providing the compensation value to logic in a phase-locked loop circuit, wherein the logic is responsive to the compensation value;
receiving the compensation value at a counter;
updating a value of the counter based on the compensation value; and
producing a voltage from a first charge pump coupled to the counter based on the value of the counter.

* * * * *